(12) United States Patent
Muraoka et al.

(10) Patent No.: US 8,575,590 B2
(45) Date of Patent: Nov. 5, 2013

(54) NONVOLATILE SEMICONDUCTOR MEMORY DEVICE

(75) Inventors: Koichi Muraoka, Sagamihara (JP); Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 13/038,771

(22) Filed: Mar. 2, 2011

(65) Prior Publication Data

US 2011/0210303 A1    Sep. 1, 2011

Related U.S. Application Data

(63) Continuation of application No. PCT/JP2008/065776, filed on Sep. 2, 2008.

(51) Int. Cl.
*H01L 47/00* (2006.01)
*H01L 27/10* (2006.01)
*H01L 29/06* (2006.01)

(52) U.S. Cl.
USPC ............ 257/5; 257/2; 257/3; 257/4; 257/62; 257/529; 257/530

(58) Field of Classification Search
USPC ...................... 257/4, 5, 326, 2, 390
See application file for complete search history.

(56) References Cited

U.S. PATENT DOCUMENTS

| | | | |
|---|---|---|---|
| 7,251,154 B2 | 7/2007 | Hush | |
| 7,479,650 B2 * | 1/2009 | Gilton | ............................... 257/4 |
| 7,772,129 B2 | 8/2010 | Matsushita | |
| 7,816,215 B2 | 10/2010 | Matsushita | |
| 8,027,188 B2 * | 9/2011 | Nagashima et al. | .......... 365/163 |
| 8,085,585 B2 * | 12/2011 | Nagashima et al. | .......... 365/163 |
| 2006/0268594 A1 * | 11/2006 | Toda | .............................. 365/100 |
| 2008/0173930 A1 | 7/2008 | Watanabe | |
| 2009/0121208 A1 * | 5/2009 | Nagashima et al. | ............... 257/2 |
| 2010/0315857 A1 * | 12/2010 | Sonehara et al. | ............. 365/148 |
| 2010/0321979 A1 | 12/2010 | Yasutake et al. | |

FOREIGN PATENT DOCUMENTS

| | | |
|---|---|---|
| JP | 5-347422 | 12/1993 |
| JP | 10-125939 | 5/1998 |
| JP | 2006-203098 | 8/2006 |

(Continued)

OTHER PUBLICATIONS

Japanese International Search Report issued Dec. 9, 2008 in PJCT/JP2008/065776 filed Sep. 2, 2008.

(Continued)

*Primary Examiner* — Zandra Smith
*Assistant Examiner* — Tsz Chiu
(74) *Attorney, Agent, or Firm* — Oblon, Spivak, McClelland, Maier & Neustadt, L.L.P.

(57) ABSTRACT

According to one embodiment, there is provided a nonvolatile semiconductor memory device including a first interconnection layer, memory cell modules each of which is formed by laminating a non-ohmic element layer with an MIM structure having an insulating film sandwiched between metal films and a variable resistance element layer, and a second interconnection layer formed on the memory cell modules, the insulating film of the non-ohmic element layer includes plural layers whose electron barriers and dielectric constants are different, or contains impurity atoms that form defect levels in the insulating film or contains semiconductor or metal dots. The nonvolatile semiconductor memory device using non-ohmic elements and variable resistance elements in which memory cells can be miniaturized and formed at low temperatures is realized by utilizing the above structures.

10 Claims, 12 Drawing Sheets

(56) References Cited

FOREIGN PATENT DOCUMENTS

| | | |
|---|---|---|
| JP | 2007-188977 | 7/2007 |
| JP | 2007-293969 | 11/2007 |
| WO | WO 2010/026624 A1 | 3/2010 |

OTHER PUBLICATIONS

Japanese Written Opinion issued Nov. 25, 2008 in PCT/JP2008/065776 filed Sep. 2, 2008.

Ryuji Ohba et al., "25 nm Planar Bulk SONOS-type Memory with Double Tunnel Junction," 2006 IEEE, Advanced LSI Technology Laboratory, Toshiba Corporation, 4 pages.

J. McPherson, et al., "Proposed Universal Relationship Between Dielectric Breakdown and Dielectric Constant", 2002 IEEE, Texas Instruments, Silicon Technology Development, 4 pages.

T. Hattori et al., "Composition, chemical structure, and electronic band structure of rare earth oxide/Si(100) interfacial transition layer", Microelectronic Engineering, vol. 72, 2004, pp. 283-287.

International Preliminary Report on Patentability and Written Opinion of the International Searching Authority Issued Apr. 12, 2011 in PCT/JP2008/065776 (English translation).

* cited by examiner

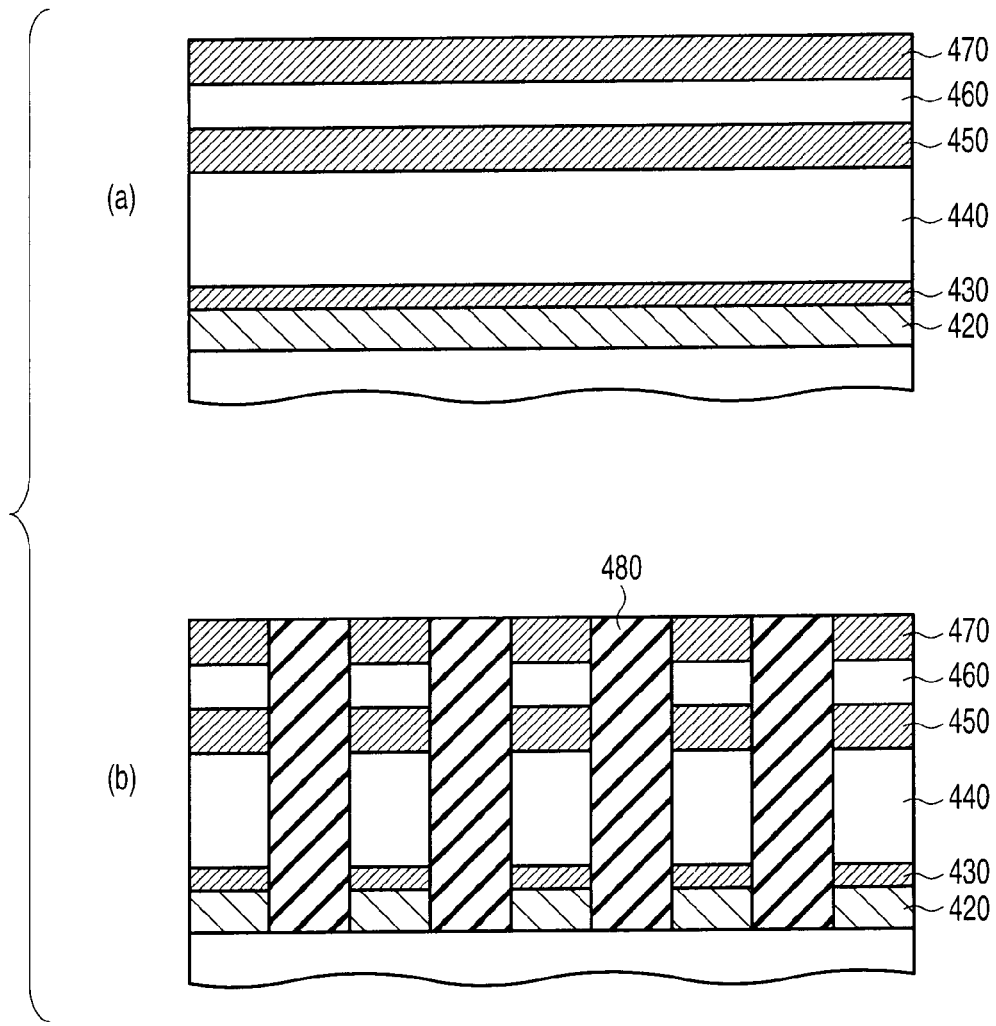
F I G. 7

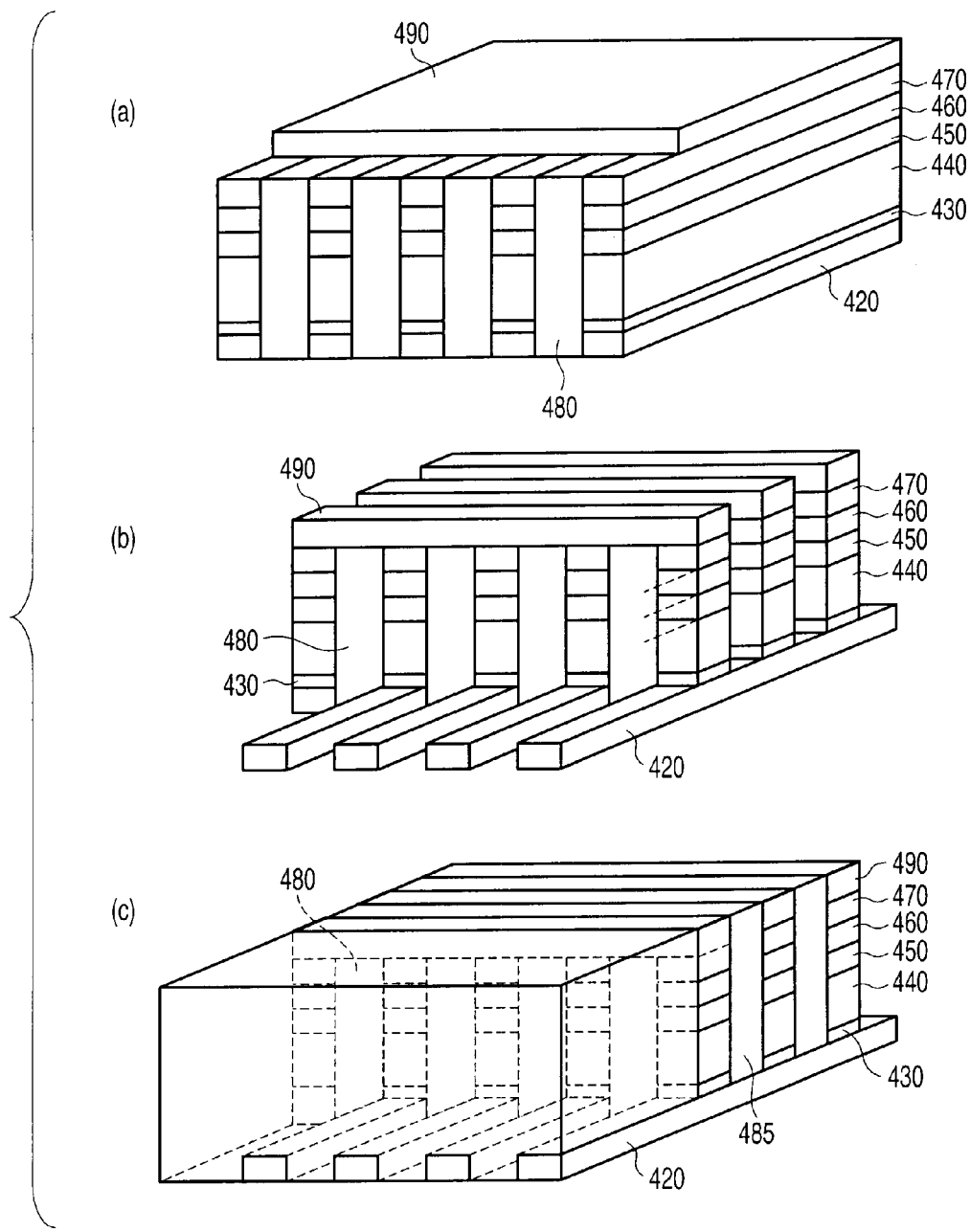
F I G. 8

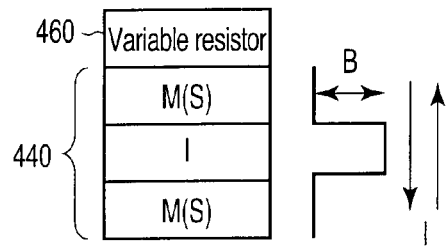
F I G. 9
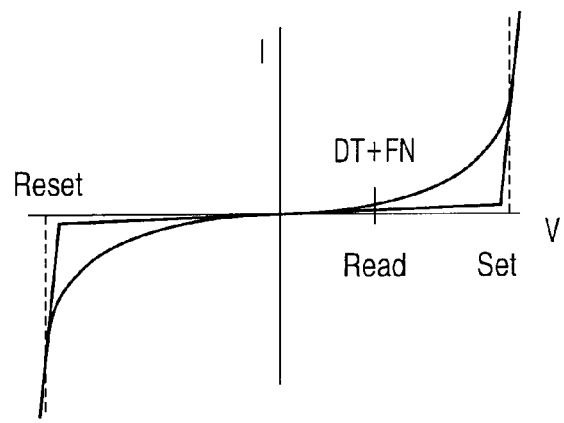
F I G. 10
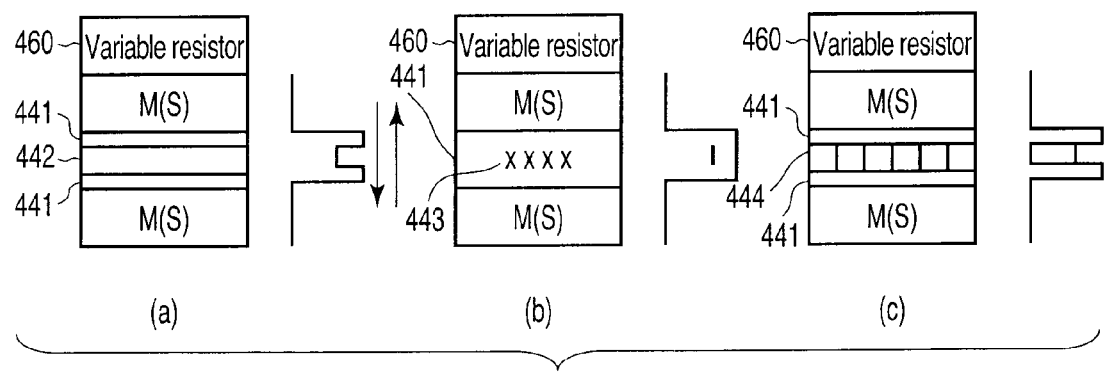
F I G. 11

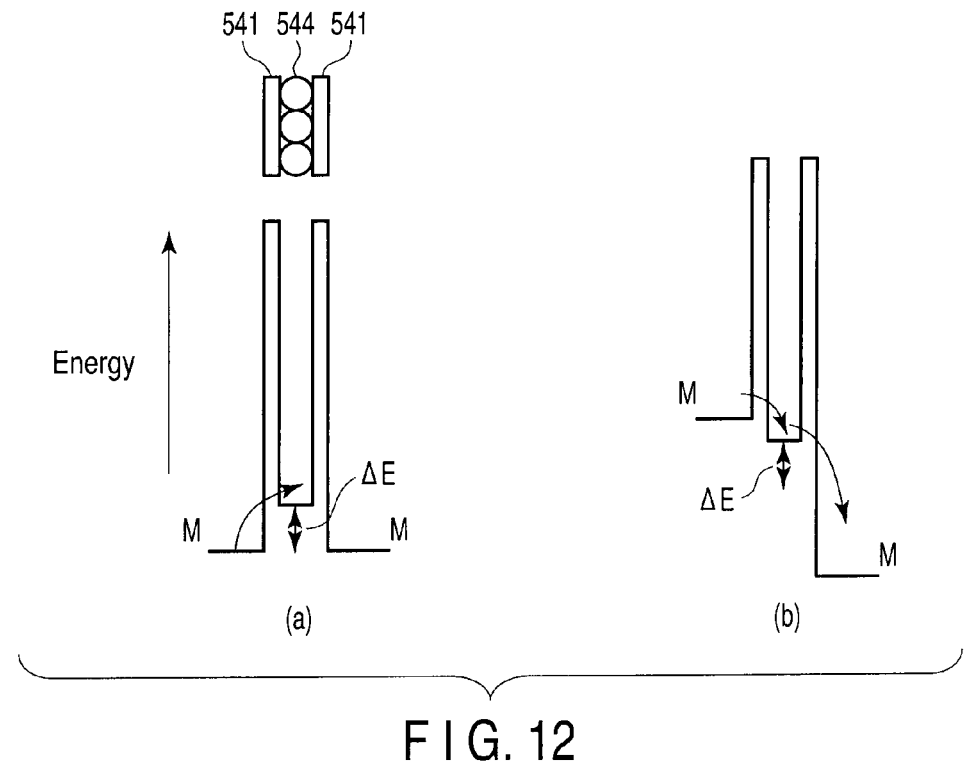
F I G. 12
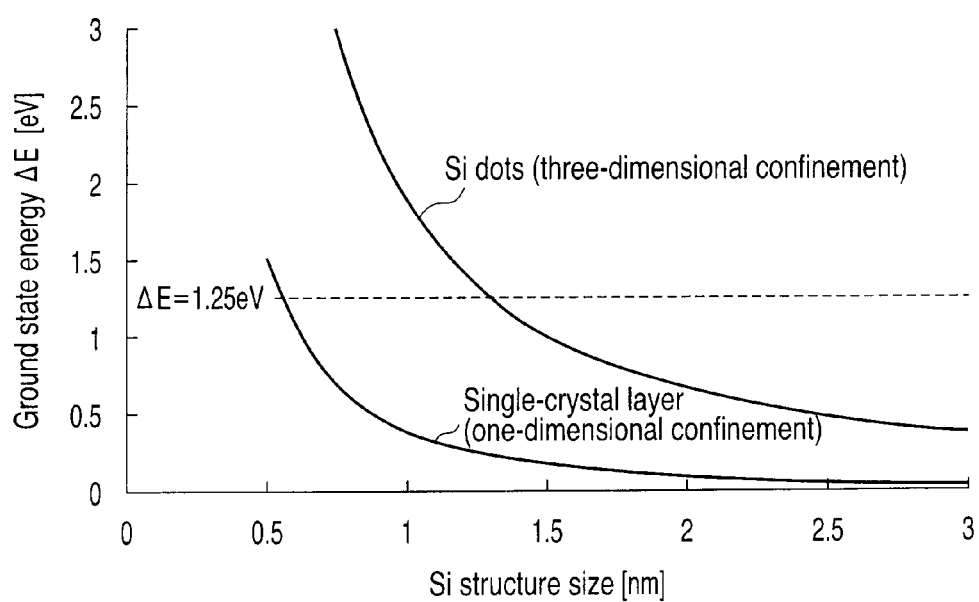
F I G. 13

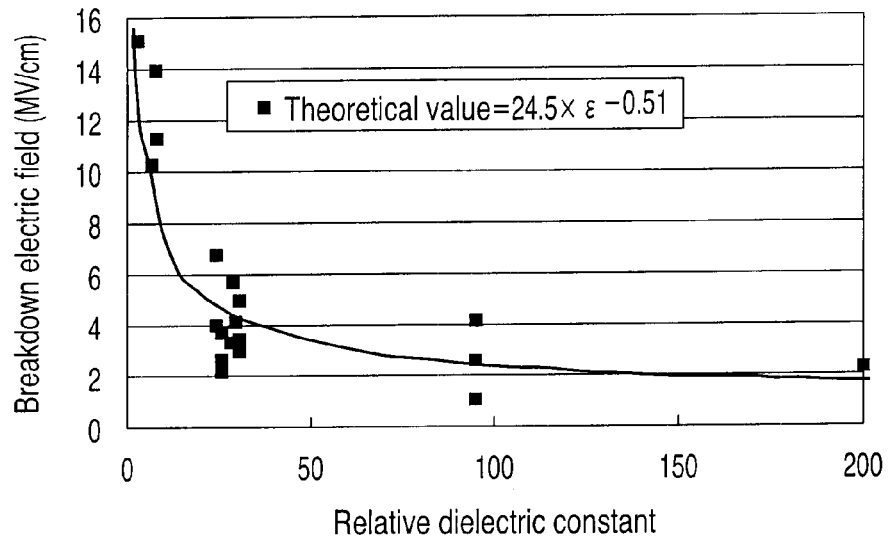
F I G. 14
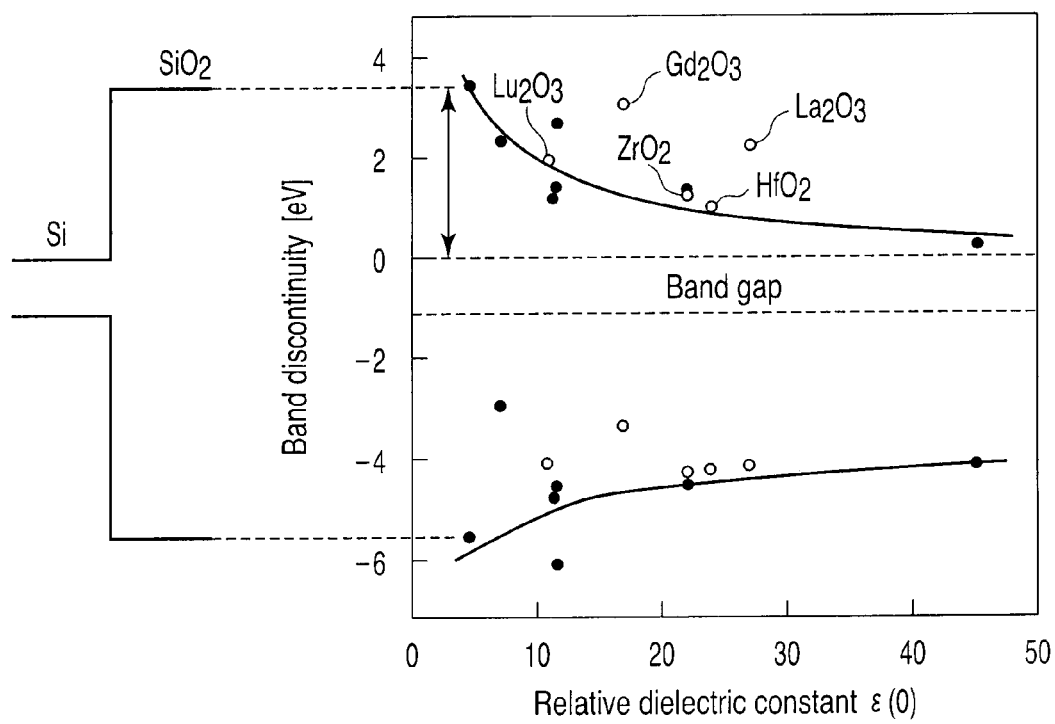
F I G. 15

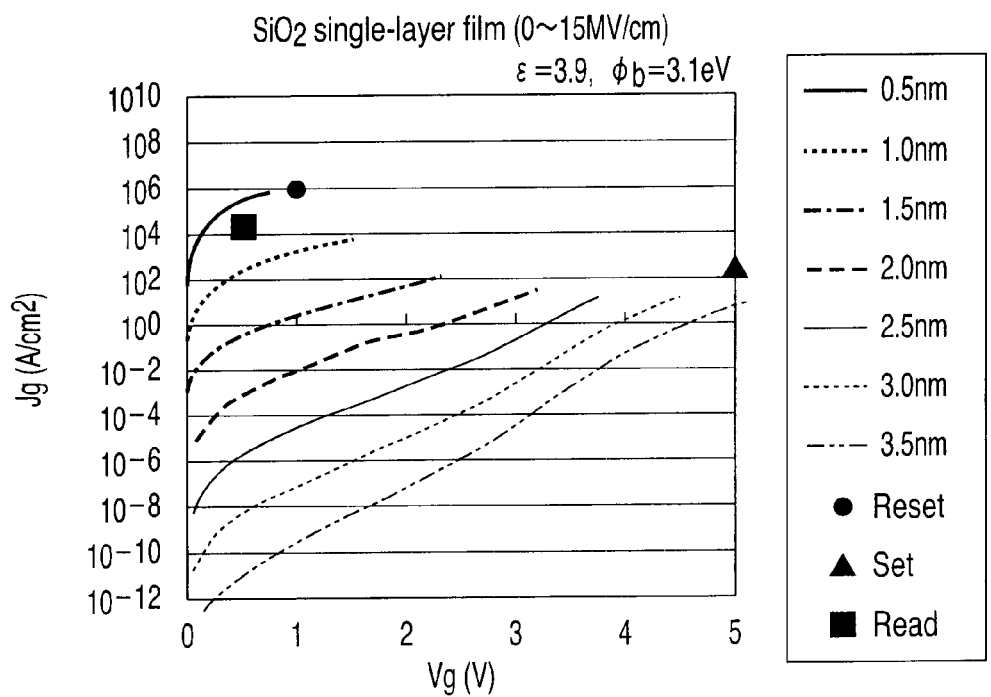
F I G. 16
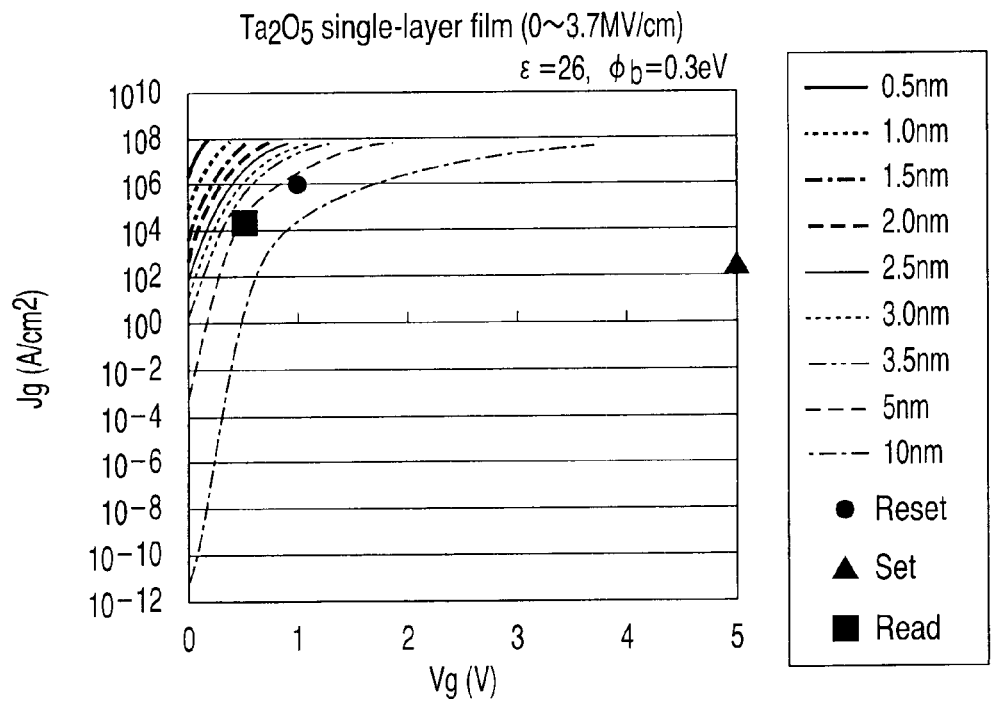
F I G. 17

US 8,575,590 B2

NONVOLATILE SEMICONDUCTOR MEMORY DEVICE

CROSS-REFERENCE TO RELATED APPLICATIONS

This is a Continuation Application of PCT Application No. PCT/JP2008/065776, filed Sep. 2, 2008, which was published under PCT Article 21(2) in Japanese, the entire contents of which is incorporated herewith in its entirety by reference.

FIELD

Embodiments described herein relate generally to a nonvolatile semiconductor memory device configured by laminating variable resistance elements and non-ohmic elements on cross-points of interconnection layers.

BACKGROUND

Recently, as new solid-state memories, memories utilizing a change in resistance (high resistance and low resistance) of a recording material and called a phase-change memory (phase-change random access memory [PCRAM]) and resistance-change memory (resistance-change random access memory [ReRAM]) are being developed to reach the practical application. The cell array of the above memories can be formed with a cross-point structure having variable resistance elements arranged between interconnection lines and a three-dimensional structure can be formed by laminating the cell arrays. Further, since the chip area can be made small by arranging a peripheral circuit below the cell array, the structure is suitable for large capacity.

As the feature of the cross-point structure, a cell structure having a non-ohmic element serially connected to a variable resistance element is attained since it is of a recording system that reads a resistance change by passing a current and a stray current that flows through an unselected cell at the read time of a selected cell is suppressed. As a result, suppression of a reverse current (prevention of reverse current) in the case of a unipolar operation and suppression of a low electric field leakage current (prevention of a leakage current) in the case of a bipolar operation can be achieved.

However, in this type of solid-state memory, the following problem occurs. That is, as the cells are further laminated, the aspect ratio of the whole cell becomes larger since the thickness of a diode portion is large in the case of pn, pin, Schottky diodes in which the non-ohmic element uses Si as a material and the miniaturization process becomes difficult. In addition, a diode peripheral portion such as a variable resistance element is thermally degraded by repeating activation heat treatment at high temperatures for each layer, problems of reading characteristic, switching characteristic degradation, variation in the resistance change of the cell, an increase in the operation current, an increase in the power consumption and the like occur.

BRIEF DESCRIPTION OF THE DRAWINGS

FIG. 7 is a cross-sectional view showing manufacturing steps of the ReRAM.

FIG. 8 is a perspective view showing manufacturing steps of the ReRAM.

FIG. 9 is a cross-sectional view showing the structure of an MIM-type non-ohmic element used for the ReRAM.

FIG. 10 is a diagram showing the I-V characteristic in the non-ohmic element of FIG. 9.

FIG. 11 is a cross-sectional view showing the structure of an MIM-type non-ohmic element used for an ReRAM according to a first embodiment.

FIG. 12 is a diagram showing the potential barrier distribution in the non-ohmic structure of FIG. 11.

FIG. 13 is a diagram showing variation in energy rise ΔE from the ground-state with respect to the Si structure size.

FIG. 14 is a diagram showing the relationship between the relative dielectric constant of various insulation materials and the breakdown electric field.

FIG. 15 is a diagram showing the relationship between the relative dielectric constant and the electron barrier height.

FIG. 16 is a diagram showing the MIM current•voltage characteristic of $SiO_2$.

FIG. 17 is a diagram showing the MIM current•voltage characteristic of $Ta_2O_5$.

DETAILED DESCRIPTION

In general, a nonvolatile semiconductor memory device according to one embodiment includes a substrate having a memory control circuit module provided on a part of a surface portion, an interlayer insulating film formed on the substrate, a first interconnection layer including a plurality of interconnection lines provided on the interlayer insulating film and arranged parallel to one another, a second interconnection layer provided separately from the first interconnection layer above the interlayer insulating film and including a plurality of interconnection lines arranged parallel to one another in a direction that intersects with the first interconnection layer, and memory cell modules that are respectively provided in intersecting portions of the first interconnection layer and second interconnection layer and each have a structure in which a non-ohmic element layer having a structure that includes an insulating film and metal films sandwiching the insulating film and a variable resistance element layer configured to store a state of a difference in resistance as information are laminated, characterized in that the insulating film of the non-ohmic element layer includes plural layers whose electron barriers and dielectric constants are different.

The best mode for embodying an example will now be explained in detail.

First, an ReRAM is explained as an embodiment.

This embodiment can be applied to another nonvolatile semiconductor memory, particularly, a resistance-change memory. Further, the memory array configuring method may not be limited to that particularly described herein. For example, in the case of a PCRAM memory array, a 1T/1R-type array may be used and a 1D/1R-type memory array may be used.

Figure 1:
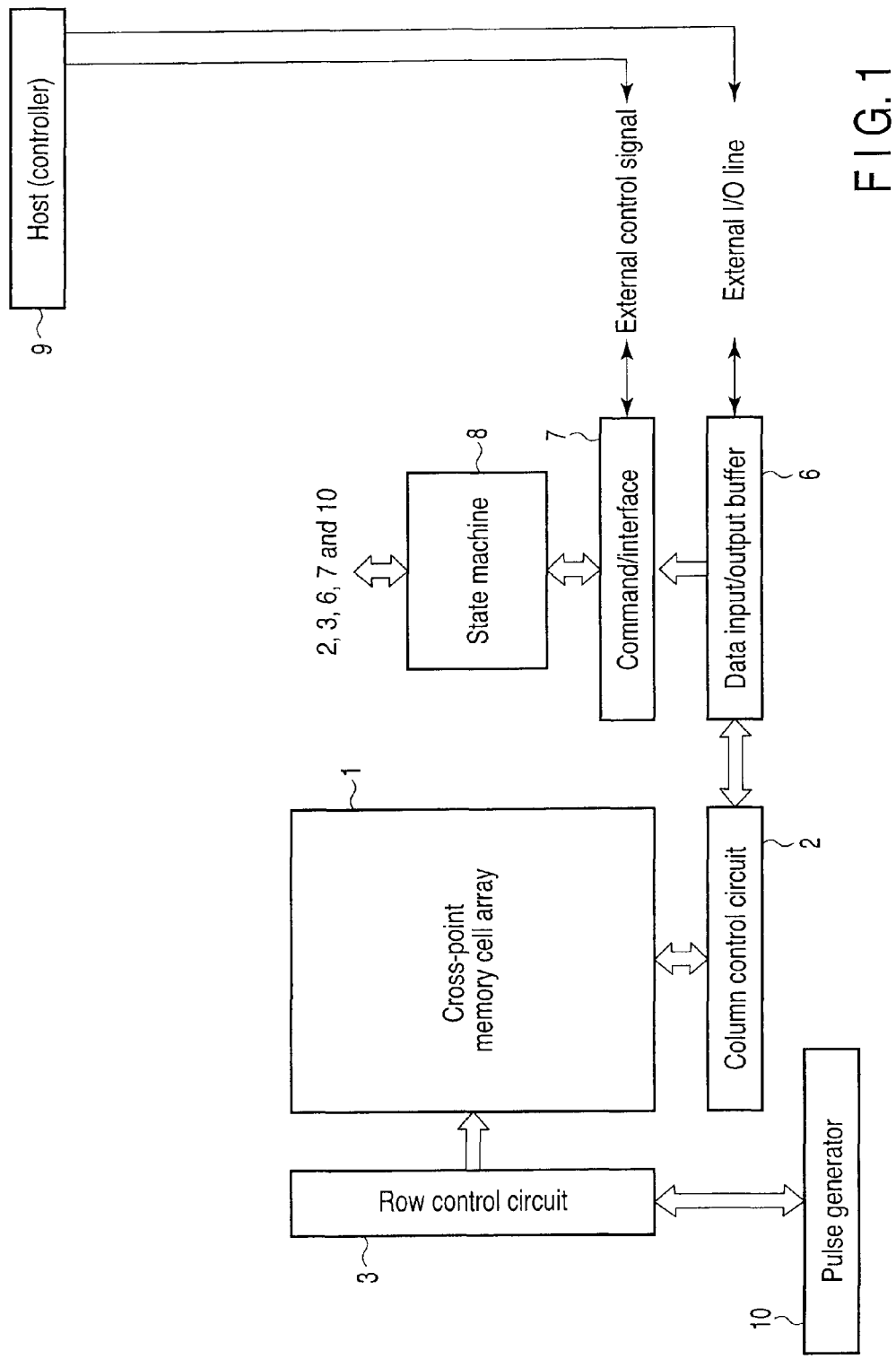
FIG. 1 is a block diagram showing the circuit configuration of a memory core module of an ReRAM.
Figure 2:
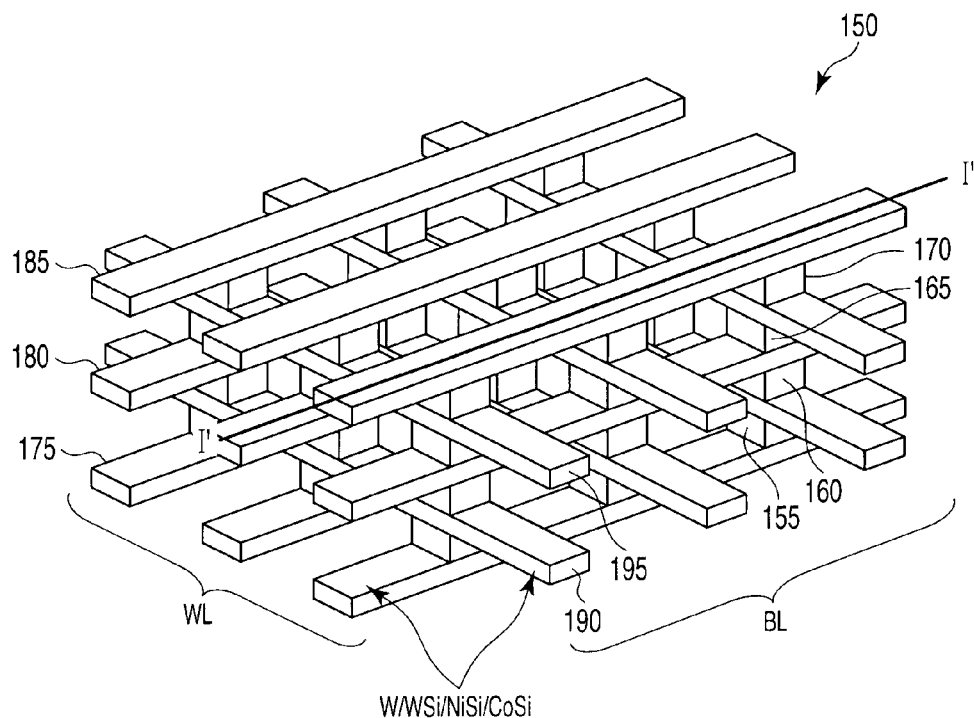
FIG. 2 is a perspective view showing the structure of cross-point portions of the ReRAM.

FIG. 1 shows the basic configuration of a nonvolatile semiconductor memory device according to a reference example. A memory cell array 1 is configured by providing ReRAM memory cells in cross-point portions of interconnection lines as shown in FIG. 2 as will be described later. In this case, the memory cells are laminated in a multi-stage form to configure a memory cell layer of a plurality of layers. Further, the cross-point memory cell array 1 can be formed in an interconnection layer, but it is not necessarily limited to this structure. For example, it is not limited to the structure in which all of WL, BL interconnection lines are connected by means of vertical memory cell arrays as shown in FIG. 2 and may also be applied to the structure in which memory cell arrays of 165 and 155 are omitted to separate them. Further, it may be the structure in which a memory cell array is inserted in a lower-layered contact region.

A column control circuit 2 that controls the bit lines BL of the memory cell array 1 and performs data erasing of the memory cell, data programming into the memory cell and data reading from the memory cell is provided. The column control circuit 2 may be provided for each MAT (Memory Allocation Table), for each sector or for each memory cell layer or may be made common (commonly provided). Further, it may be commonly used for a plurality of BLs to reduce the area.

A row control circuit 3 is provided to select the word line WL of the memory cell array 1 and apply voltages required for erasing, programming and reading. The row control circuit 3 may be provided for each memory cell layer or may be made common to reduce the area. Further, the memory cell array 1 can be divided into MATs of memory cell groups, and at this time, control circuits can be provided for individual MATs or commonly provided for a plurality of MATs. Further, the memory cell array 1 may include a global BL and global WL and include sectors divided by select transistors.

On the other hand, a data input/output buffer 6 is provided that is connected to an external host 9 via an I/O line, receives program data, receives an erase instruction, outputs read data and receives address data and command data. The buffer 6 supplies the received program data to the column control circuit 2 and receives data read from the column control circuit 2. Further, read data can be latched in the column control circuit 2 and the data can be output from the I/O line to the exterior via the input/output buffer 6.

Further, a command•interface 7 that receives command data from the host 9 and a state machine 8 that selects the memory cell are provided.

The command•interface 7 receives a control signal from the host 9, determines whether data input to the data input/output buffer 6 is program data, command data or address data and transfers data as a received command signal to the state machine 8 if it is command data. The state machine 8 supplies address data from the exterior to the column control circuit 2 and row control circuit 3 to manage the whole ReRAM memory and receives a command from the host 9 to perform reading, programming, erasing and data input/output management and the like.

Further, the host 9 receives status information that the state machine 8 manages and can determine the operation result. In addition, status information is also utilized for program and erase control.

Further, peripheral circuit elements (memory cell control circuits) such as the column control circuit 2, row control circuit 3, data input/output buffer 6, command•interface 7, state machine 8 and the like can be formed on an Si substrate immediately below the memory array formed on an interconnection layer. As a result, the chip area of the nonvolatile semiconductor memory device can be made almost equal to the area of the memory cell array.

Further, a pulse generator 10 is controlled by the state machine 8. By the control, the pulse generator 10 can output a pulse of a given voltage and given timing. In this case, the formed pulse can be transferred to a given interconnection line selected by the row control circuit 3.

FIG. 2 is a perspective view showing the configuration of the memory cell array 1. 175, 180, 185 in the drawing indicate word lines (WL) as first interconnection layers, 190, 195 indicate bit lines (BL) as second interconnection layers and 155, 160, 165, 170 indicate memory cell nodules.

The memory cell array 1 is of a cross-point type, and in this case, it is a four-layered stack memory cell array. The cross-point structure indicates the structure having cells sandwiched at intersections between first interconnection lines arranged parallel to one another and second interconnection lines intersecting therewith. In this example, the above structures are deposited in plural layers. In this case, repetition of interconnection line/cell/interconnection line/cell/interconnection line is made, but the structure of interconnection line/cell/interconnection line/interlayer insulating film/interconnection line/cell/interconnection line can be formed.

With the former structure, the number of layers becomes less and the cost merit can be attained, but the number of cells commonly used by one interconnection line is increased and deterioration in the reliability such as deterioration in the performance, disturbance of the unselected cell and the like is considered. With the latter structure, the number of interconnection layers is increased and the cost becomes high, but since the number of cells connected to one interconnection line becomes half that of the former structure, it is suitable for the high-speed operation and is better than the former structure in the reliability.

Figure 3:
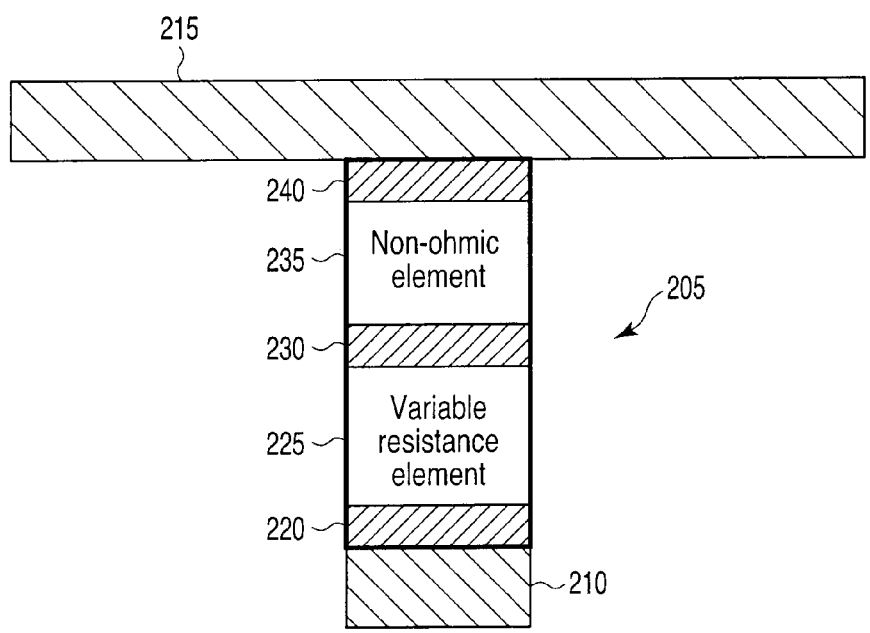
FIG. 3 is a cross-sectional view schematically showing the memory plug structure of the ReRAM.

FIG. 3 shows a concrete memory element structure. In the drawing, 210 indicates an interconnection layer, it is desired to use a material that is highly resistant to heat and a material having low resistance and, for example, it is formed of W/WSi/NiSi/CoSi or the like. 225 indicates a variable resistance element whose resistance can be varied according to a voltage, current or heat, chemical energy or the like and the variable resistance element 225 stores a state of a difference in resistance as information. 220 indicates a lower electrode of the variable resistance element 225 and 230 indicates an upper electrode of the variable resistance element 225. The respective electrodes 220, 230 can simultaneously play roles as barrier metal and adhesive layers and are formed of Pt/Au/Ag/TiAlN/SrRuO/Ru/RuN/Ir/Co/Ti/TiN/TaN/LaNiO/Al/PtIrOx/PtRhOx/Rh/TaAlN or the like. Further, a metal film that makes alignment uniform can be inserted. Further, a buffer layer, barrier metal layer, adhesive layer and the like can be additionally inserted.

235 indicates a non-ohmic element and, in this embodiment, a metal-insulator-metal (MIM) structure, silicon-insulator-silicon (SIS) structure or the like is used. Since an Si structure is a structure using one type of metal, the explanation is made on the assumption that the SIS structure is contained in the MIM structure in the following description.

Figure 4:
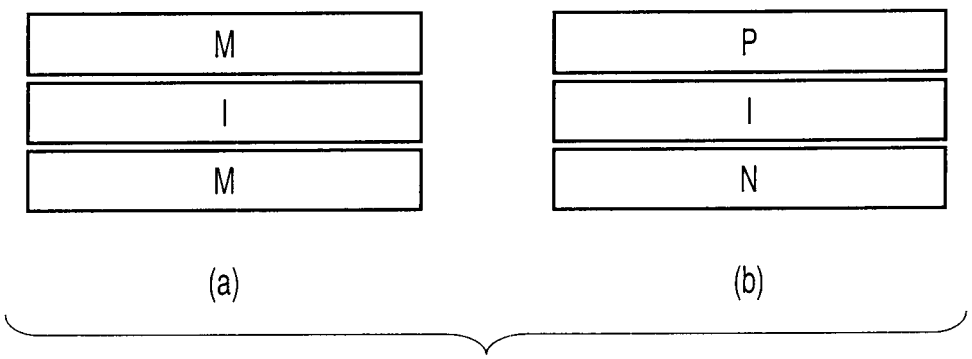
FIG. 4 is a cross-sectional view schematically showing the structures of non-ohmic elements used for the ReRAM.

FIG. 4(a) shows an example of the MIM structure of the present embodiment and FIG. 4(b) shows an example of a pin structure as a reference example. In the MIM structure of the present embodiment, the insulating film includes a plurality of layers having different electron barriers and dielectric constants, includes impurity atoms that form defect levels in the insulating film or includes semiconductor or metal dots. With the above structure, the ratio of currents at the read time (off) and at the set, reset time (on) can be increased in comparison with the conventional single-layered insulating film. Also, in this case, a barrier metal layer or adhesive layer may be inserted. According to the MIM structure of this embodiment and the like, the unipolar operation and bipolar operation can be performed.

215 indicates a second interconnection line that intersects with the first interconnection line 210 and is formed of W/WSi/NiSi/CoSi or the like. Further, 240 indicates a barrier metal layer or adhesive layer between the non-ohmic element 235 and the second interconnection layer 215 and is formed of Ti/TiN or the like. Further, the MIM structure is used for the non-ohmic element 235 and has a mirror structure with BL set at the center in this case, but the arrangement of the non-ohmic element 235 is not limited to this case. Such a case can be coped with by changing the bias relationship between WL and BL. In this example, both of the unipolar operation and bipolar operation can be performed.

Figure 5:
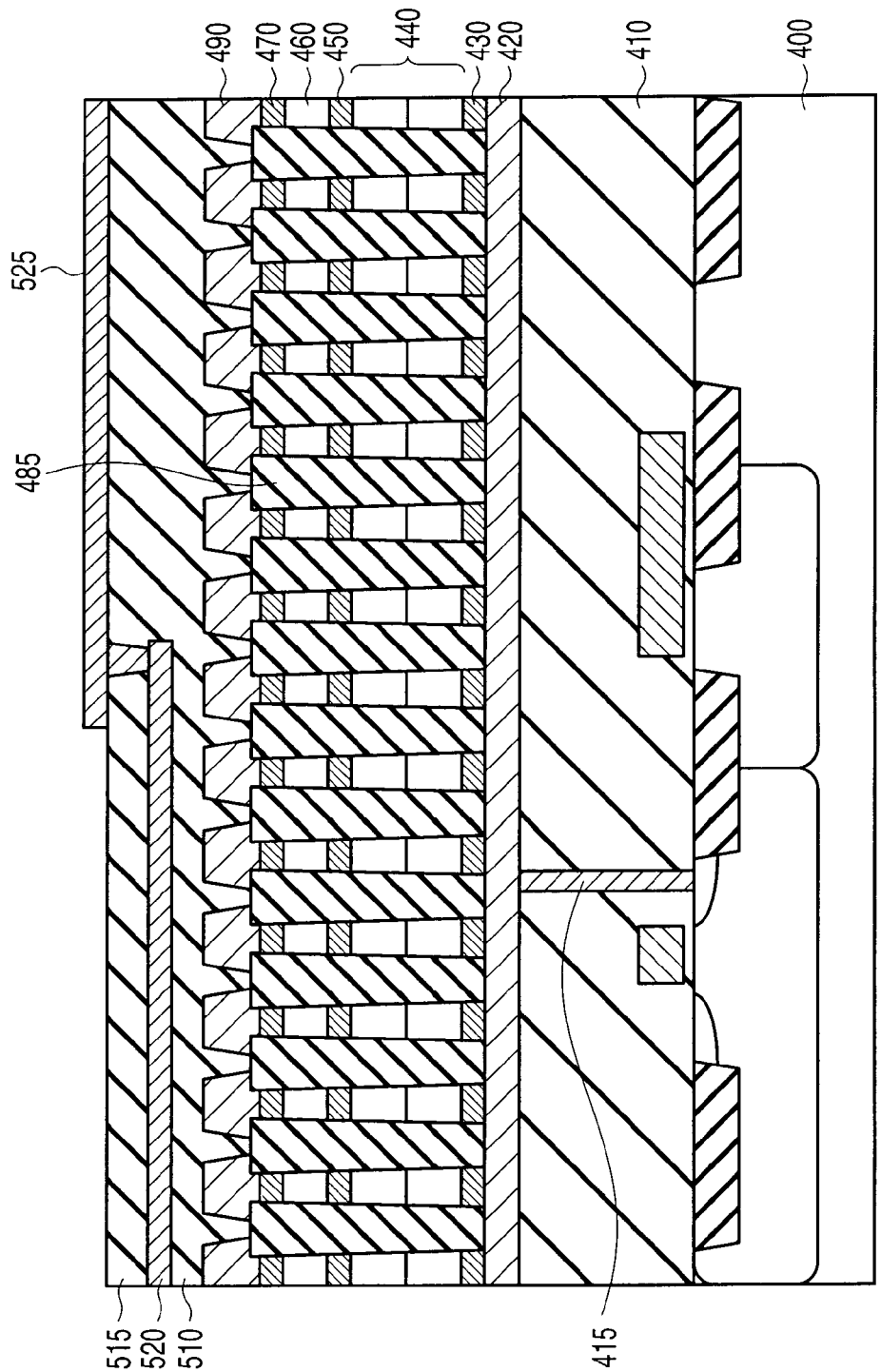
FIG. 5 is a cross-sectional view schematically showing the memory element structure of the ReRAM.

FIG. 5 is a cross-sectional view showing the memory element structure of the ReRAM.

A control circuit module of a peripheral circuit and the like is formed in an active region of a substrate surface portion by performing a front-end-of-line (FEOL) process on an Si substrate 400. A first interlayer insulating film 410 is deposited on the substrate 400 and a via 415 used to make contact with a lower device is formed in the interlayer insulating film 410.

On the interlayer insulating film 410, a first interconnection layer 420 of a cross-point array is formed of W (another low-resistance metal can also be applied) and barrier metal layers 430 are formed of Ti/TiN on the upper layer thereof. Barrier metals can also be formed under the lower layer of the first interconnection layer 420. Further, the barrier metal layer 430 in this case can be formed of both of Ti and TiN or either one of them. Further, a barrier metal can be inserted after formation of the above upper layer.

On the barrier metal layers 430, diodes used as non-ohmic elements 440 are formed. In this embodiment, as the non-ohmic element 440, an MIM structure or the like is used.

On the non-ohmic element 440, a lower electrode 450 used as an electrode of a variable resistance element, variable resistance element material layer 460, upper electrode 470 are formed. As a result, a memory cell having the non-ohmic element and variable resistance element serially connected is formed. Further, barrier metals may be inserted outside the upper, lower electrodes or barrier metals or adhesive layers may be inserted into the interiors thereof. In this case, second and third interlayer insulating films 480, 485 are filled between the memory cells and the memory cells. However, the second interlayer insulating films 480 are not shown in the cross section. Further, on the upper electrodes 470, second interconnection layers 490 of a cross-point array are formed.

In addition, fourth, fifth interlayer insulating films 510, 515 are formed above the substrate on which the layers up to the second interconnection layers 490 are formed and metal interconnection layers 520, 525 and the like are formed on the interlayer insulating films 510, 515.

Figure 6:
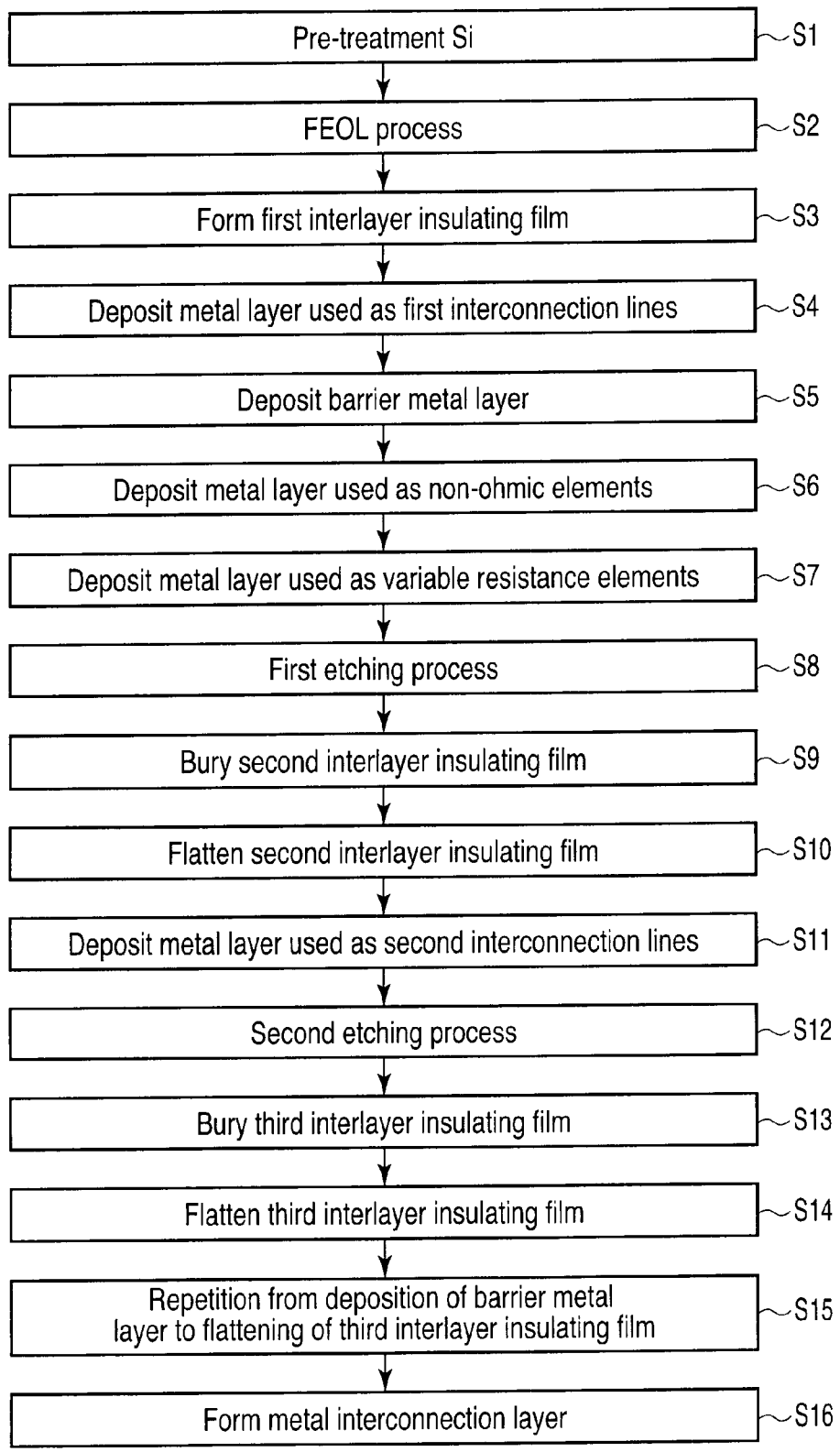
FIG. 6 is a diagram showing a process flow of an ReRAM.

FIG. 6 is a diagram showing a process flow of the ReRAM shown in FIG. 5. First, an Si substrate 400 is prepared (step S1), an FEOL process is performed on the Si substrate 400 (step S2) and a first interlayer insulating film 410 is deposited on the upper portion thereof (step S3). Further, a via 415 is formed at this time.

Next, a first metal layer used as the first interconnection layer 420 of a cross-point array is deposited by use of W (another low-resistance metal can also be applied) (step S4) and a barrier metal layer 430 is formed of Ti/TiN on the upper layer thereof (step S5). Further, a barrier metal layer may also be formed on the lower layer of the metal layer used as the first interconnection layer 420. Further, the barrier metal of this case can be formed of both of Ti and TiN or either one of them. Further, a layer used as non-ohmic elements 440 is deposited above the layer (step S6).

In this case, an MIM structure or the like is formed as the non-ohmic element 440. In the case of the MIM structure, as a material, metal or poly-Si having a high work function may be used. Further, the insulating film portion may be formed of a single layer or band-engineered by use of two or more layers.

Next, a variable resistance element layer used as a memory element layer is deposited (step S7). In this case, a lower electrode 450, variable resistance element material layer 460, upper electrode 470 are formed. As described before, barrier metal layers may be inserted outside the upper, lower electrodes or barrier metal layers or adhesive layers may be inserted into the interiors thereof. Further, a layer used as a hard mask for etching or CMP may be deposited on the upper layer thereof. The cross section of the first deposition layer having a solid film deposited up to 420 to 470 is shown in FIG. 7(a).

As the variable resistance element material layer 460, a phase-change material such as $Ge_2Sb_2Te_2$ or another chalcogenide-series substance, an ion-conductive material such as Ag-rich Ag—Ge—Se-series chalcogenide substance or $Cu_2S$, rotaxane supermolecule or another molecular material, a material having a structure that has a metal layer sandwiched between insulating films, a material including a colossal magneto resistive (CMR) substance such as $PrCaMnO_3$ can be used. Further, spin injection MTJ utilizing electron spins, a substance indicating a huge magnetoresistive effect such as $PrCaMnO_3$, Ag—Ge—Se series, ZnxCdS, $Ag_2S$ known as a resistance-change memory element, $NiO_x$, $TiO_x$, $HfO_2$, $ZrO_2$, $SrZrO_3$, $SrTiO_3S$ or the like can be used.

After this, a first etching process is performed (step S8). Thus, the first deposition layer is first processed with an L/S of minimum pitch. Next, a second interlayer insulating film 480 is filled (step S9) to fill space portions of L/S processed in S8. As a material of the interlayer insulating film 480, it is preferable to use a material having a highly insulating property and good filling characteristic with low capacity. Next, the second interlayer insulating film 480 is made flat (step S10) and an extra insulating film is removed and electrode portions are exposed by a CMP method. The cross section at this time is shown in FIG. 7(b). At this time, if a hard mask is used, etching thereof or the like becomes necessary.

Next, tungsten is deposited on a flattened portion after CMP by deposition (step S11) of a metal layer used as a second interconnection layer 490. An image view at this time is shown in the perspective view of FIG. 8(a).

After this, a second etching process (step S12) is performed with L/S in a direction intersecting with the first etching process with respect to the second deposition layer up to 430 to 490. As a result, as shown in FIG. 8(b), a second interconnection layer 490 including a plurality of interconnection lines arranged parallel to one another in a direction perpendicular to the first interconnection layer 420 is formed.

Next, a cross-point memory array layer as shown in FIG. 8(c) can be formed by filling a third interlayer insulating film 485 (step S13) and flattening the third interlayer insulating film 485 (step S14) again.

Thus, a process in which cell portions can be formed in a self-alignment fashion by laminating solid films and performing two patterning processes for L/S and much attention is not necessarily paid to misalignment can be provided.

Then, a laminated cross-point memory cell array can be formed by repeatedly forming the laminated structure (step S15). At this time, a memory cell array commonly having an interconnection line of the adjacent memory cell arrays of the upper layer and lower layer can be realized by starting the repetition from deposition of the barrier metal layer. Further, a memory cell array that does not commonly have an interconnection line of the adjacent memory cell arrays of the upper layer and lower layer can be realized by starting the repetition from formation of the first interlayer insulating film 410. The merit and demerit caused by the above difference is described before.

After this, a metal interconnection layer is formed (step S16) and a nonvolatile semiconductor memory device of this reference example is completed.

First Embodiment

In this embodiment, a non-ohmic element structure for the bipolar operation having an MIM structure as shown in FIG. 9 is considered. A band structure having electron barrier B and the direction of current I are shown on the right side of the MIM structure in the drawing.

In a normal Si diode, it is considered to apply an MIM tunnel diode structure having an insulating film that can be made thin and formed at low temperatures since the aspect ratio is large and the temperature of active heat treatment is excessively high. However, with a simple MIM structure, a leakage current component directly configured by the sum (DT+FN) of a tunnel current and an FN tunnel current is obtained as shown in FIG. 10 and there occurs a problem that a leakage current at the low voltage at the read time becomes excessive.

The insulating film structure of this embodiment is explained with reference to FIG. 11. As the non-ohmic element structure for the bipolar operation, three types including a laminated type, impurity level type, and dot type are preferable.

The feature of the laminated type shown in FIG. 11(a) is the structure in which an insulating material 442 with a small electron barrier and large dielectric constant is arranged in the central portion of an insulating film 441 of the MIM structure in the thickness direction. For example, $SiO_2$ is used as a main material of the insulating film 441 and $Ta_2O_3$ is used as the insulating material 442. In this case, a leakage current is reduced in high electron barriers on both sides in a low electric field and a leakage current is increased by preferentially bending bands of insulating films with low dielectric constants on both sides in a high electric field. As a result, the ratio of currents at the read time (off) and at the set, reset time (on) can be increased in comparison with the single-layered insulating film.

The feature of the impurity level type shown in FIG. 11(b) is that a trap level is formed by adding impurity elements 443 in the central portion of an insulating film 441 of the MIM structure in the thickness direction and a tunnel current via the level is used. In this case, the tunnel current via the level is increased by application of a high electric field and the same effect as that of the laminated type can be attained.

The feature of the dot type shown in FIG. 11(c) is that semiconductor or metal fine crystals (dots) 444 are buried in the central portion of an insulating film 441 of the MIM structure in the thickness direction. When the dot size is reduced to several nm, the conduction band end or Fermi level rises by the coulomb blockade effect and the same concave potential barrier distribution as that of the laminated type is achieved (R. Ohba et al.; IEDM Tech. Dig., p. 959 [2006]) as shown in FIG. 12(a)(b). As a result, the same effect as that of the laminated type can be attained.

$\Delta E$ in FIG. 12 indicates coulomb blockade energy, 541 a tunnel oxide film with a thickness of 1 nm, and 544 Si fine crystals with a diameter of 1.2 nm. Further, FIG. 12(a) shows a state in which no current flows and FIG. 12(b) shows a state in which a current flows with voltage application. As one example, energy rise $\Delta E$ (eV) from the base state with respect to the Si structure size is shown in FIG. 13. Based on the calculation result, $\Delta E$ of Si dots is large with respect to a single-layered Si thin film and a large barrier of $\Delta E=1.25$ eV (specification realization boundary) or more can be attained by setting the size thereof to 1.3 nm or less. Further, since the Si—Si bonding length is approximately 0.2 nm, it is preferable to set the Si dot size in the range of 0.2 to 1.3 nm. The range approximately coincides with the range of another semiconductor material, metal material.

The above insulating film structure is not only independently used but also combinations thereof can be made. Further, one example of the combination of applied materials is shown below.

Laminated insulating film: center ($Ta_2O_5$, $SiO_2$)×both ends ($SiO_2$, SiN, $Al_2O_3$) or the like Impurity insulating film: base material ($SiO_2$, SiN, $Al_2O_3$, high-k/$SiO_2$)×impurity (Ge, N, Al) or the like Dot insulating film: base material ($SiO_2$, $Al_2O_3$)×dots (Si, Ge, Al) or the like As the characteristics required for the above insulating films, a high breakdown withstand voltage is given. This is because high voltage application is required at the set time of the variable resistance element and it becomes necessary to increase the withstand voltage by changing the film thickness according to the insulating material.

FIG. 14 shows the relationship between the relative dielectric constant of various insulation materials and the breakdown electric field (J. McPherson et al., IEDM04), but the bonding of a film (high-k material) whose local electric field in the material is strong tends to be broken and the withstand voltage is low. Therefore, it is necessary to increase the film thickness, but there occurs a problem that a leakage current is exponentially reduced.

FIG. 15 shows the relationship between the relative dielectric constant and the electron barrier height (XPS measurement by Prof. T. Hattori, INFOS 2003.), but the problem of an increase in the film thickness can be solved by selecting a high-k material whose electron barrier is low. The dielectric constant and electron barrier are correlated with each other and the high dielectric constant is attained in a low-$\phi_b$ film.

FIG. 16 shows the MIM current-voltage characteristic of $SiO_2$ and FIG. 17 shows the MIM current•voltage characteristic of $Ta_2O_5$. It is understood from FIG. 16 that reset, read specifications are set closer to the $SiO_2$ single-layered characteristic, but the withstand voltage cannot be maintained and the leakage current becomes excessively low if the withstand voltage is mainly treated. That is, it is indispensable to make a combination with a low-$\phi_b$ film. In the case of $Ta_2O_5$, it is understood from FIG. 17 that the withstand voltage can be increased while the specifications are set closer to reset, read specifications. That is, the leak asymmetry, leak specification and high withstand voltage can be simultaneously achieved by lamination of thick Low-$\phi_b$ film/thin High-$\phi_b$ film.

Based on the calculation result, it is difficult to simultaneously attain the withstand voltage and leakage current when the film thickness is increased with $SiO_2$, but they can be approximately attained by increasing the film thickness with $Ta_2O_5$, and required various characteristics containing leak asymmetry can be realized by use of a combination of the laminated insulating films.

Next, the actual film thickness range of the insulating film 441 in the non-ohmic element 440 is described. Based on FIG. 14, the relationship between relative dielectric constant $\epsilon$ of the single-layered insulating film and breakdown electric field E (MV/cm) is expressed by the following equation.

$$E = 24.5 \times \epsilon^{-0.51} \quad (1)$$

In this case, the relationship between actual film thickness T (nm) that makes an etching process possible and prevents dielectric breakdown and voltage V (V) applied to the non-ohmic element can be changed from Equation (1) to the following expression.

$$10W > T > V/(2.45 \times \epsilon^{-0.51}) \quad (2)$$

W (nm) indicates the lateral width of the non-ohmic element and the aspect ratio that makes an etching process possible is set to 10 or less. The equation limits the range of total actual film thickness T of the base materials in the impurity insulating film and dot insulating film. Further, the structure suitable for the bipolar operation is obtained by setting the impurity and dot average positions at this time within ±0.2×T from the center of the base material. The relational equation in the single-layer film expands to a three-layered case. Voltages $V_1, V_2, V_3$ respectively applied to respective layers of dielectric constants $\epsilon_1, \epsilon_2, \epsilon_3$ and actual film thicknesses $T_1, T_2, T_3$. are described by the following relational equations based on the voltage distribution and Gauss' law.

$$V = V1 + V2 + V3 \quad (3)$$

$$\epsilon_1(V_1/T_1) = \epsilon_2(V_2/T_2) = \epsilon_3(V_3/T_3) \quad (4)$$

Actual film thickness $T_1$ that prevents the first-layer film from being dielectrically broken down is expressed by the following expression.

$$T_1 > V_1/(2.45 \times \epsilon_1^{-0.51}) \quad (5)$$

$$V_1 = V/\{(\epsilon_1/T_1)(T_2/\epsilon_2 + T_3/\epsilon_3) + 1\} \quad (6)$$

$$10W > T1 + T2 + T3 \quad (7)$$

In the second- and third-layered cases, only the relation of subscripts 1, 2, 3 of the denominator of Equation (6) is exchanged and the relationships of Equations (5) and (6) can be applied as they are. This limits the actual film thickness range of the three-layered laminated insulating film described in this embodiment.

Further, if it is expanded to an n-layered laminated film, the range of actual film thickness $T_i$ that prevents an i-th layer from being dielectrically broken down is indicated as follows. Even in a multi-layered structure with three or more layers, a highly reliable non-ohmic element structure can be realized in a limited range in Equations (8), (9) and (10).

$$T_1 > \frac{V_i}{2.45 \times \varepsilon_1^{-0.51}} \quad (8)$$

$$V_i = \frac{V}{1 + \frac{\varepsilon_i}{T_i} \sum_{j \neq i}^{n} \left(\frac{T_j}{\varepsilon_j}\right)} \quad (9)$$

$$10W > \sum_{i=1}^{n} T_i \quad (10)$$

In this embodiment, an application example of oxide, nitride as an insulating material is mainly described, but this embodiment can be applied to a material that satisfies the condition of the three types of insulating film structures and the effectiveness of a silicate film, aluminate film, oxynitride film, mixed film and various multi-layer films can be maintained. Further, the same effect can be attained even when a film is formed not by use of the film formation method of the above materials but by use of sputtering, atomic layer CVD (ALCVD), vapor deposition and plasma CVD or the like.

Further, in the cross-point memory forming process, it is indispensable to perform selective oxidation that oxides and recovers only process damage (defects) of the side surfaces of the non-ohmic element without oxidizing metal interconnection lines, electrodes. Therefore, a damage-free cell structure is completed by heating in an atmosphere in which heavy water ($D_2O$) is discharged to selectively oxidize defects of the side surfaces of the insulating film of the non-ohmic element without oxidizing metal interconnection lines electrodes. The discharging condition at this time is shown below.

Temperature rise in vacuum→$D_2O$ discharging (2.45 GHz, 100 W, 20 mTorr) 310° C., 30 minutes→temperature down in vacuum The selective oxidation by $D_2O$ discharging used in this embodiment is a method that adequately utilizes the fact that the balance between the reduction reaction by D radicals created by discharging and the oxidation reaction by OD radicals and O radicals is different depending on materials. Since the magnitude relationship of the balance of oxidation and reduction under the radical atmosphere coincides with the magnitude relationship of free energy ΔG of creation of oxides in respective constituent materials, it is important to expose a cell structure to a radical atmosphere containing both of D atoms and O atoms in a temperature range in which ΔG of metal interconnection line•electrode materials has a larger value than ΔG of the insulating film of the non-ohmic element. It is not limited to the above discharging condition and can be adequately varied.

In this case, in the $D_2O$ discharging condition, it is preferable to set the water pressure 1 to 200 mTorr, application power 10 to 500 W and is effective in a range of the substrate temperature from room temperature to 700 degrees. It is more preferable to set the water pressure to 10 to 100 mTorr, 10 to 50 mTorr and 20 to 30 mTorr. Further, a more preferable result can be obtained in a range of the substrate temperature from room temperature to 500 degrees and application power of 100 W or more. Additionally, as the discharging method, a method of a plane-parallel plate type using RF, a magnetron type using a magnet or electromagnet or using helicon waves or the like is provided in addition to a method using microwaves.

Further, the same effect can be obtained in the radical atmosphere in which gaseous mixtures of $D_2O$ and $O_2$, $D_2$ and $D_2O$, $D_2$ and NO, $D_2$ and $N_2O$ or the like are discharged or respectively independently discharged. Further, a low-temperature process can be performed by using radicals and contamination by various metals can be completely neglected.

The selective oxidation condition by $D_2O$ discharging can provide the same effect in $H_2O$ discharging. However, in $D_2O$ discharging, since the diffusion speed in the film of D atoms fetched into a peripheral material is low due to the difference in the mass number unlike H atoms, there is less possibility of creating new defects in comparison with H atoms. That is, the electrical reliability of the cell structure containing D atoms becomes high.

In this embodiment, a case of the radical atmosphere containing both of D atoms and O atoms is described. However, the same or better effect can be obtained by adding various noble gases (He, Ne, Ar, Kr, Xe and the like). For example, since active O1D radicals are more actively excited when Kr is added, process damage (defects) of the side surfaces of the non-ohmic element can be efficiently recovered and it becomes preferable to select diluted gas according to the object of the process.

Thus, according to the present embodiment, in the nonvolatile semiconductor memory cell array using the non-ohmic elements, the non-ohmic element is an insulating film that can be made thin and formed at low temperatures and a non-ohmic characteristic can be attained by controlling a leakage current via the dots and defect levels of the insulating film and the electron barrier distribution of the insulating film. As a result, miniaturization can be made possible and an influence by thermal deterioration can be eliminated and therefore, the read/switching characteristic can be improved, and a variation in the resistance change of the cell can be improved. As a result, a nonvolatile resistance-change memory of large capacity in which the operation current is low and the power consumption can be reduced can be realized. Therefore, the merit in the industry is great as the next-generation technology that overcomes the barrier of the recording density in the present nonvolatile memory.

Second Embodiment

A non-ohmic element structure for the unipolar operation is considered as a second embodiment.

Figure 18:
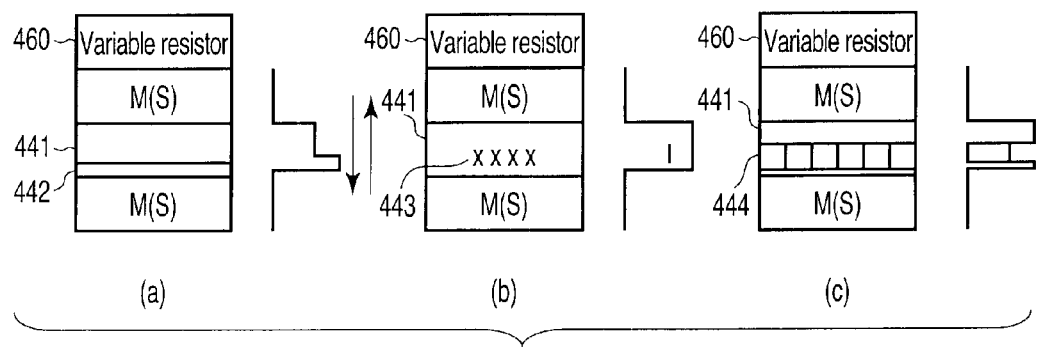
FIG. 18 is a cross-sectional view showing the structure of an MIM-type non-ohmic element used for an ReRAM according to a second embodiment.

In this case, the insulating film structure for the unipolar operation is explained with reference to FIG. 18. In the non-ohmic element structure for the unipolar operation, three types of a laminated type, impurity level type and dot type are preferable.

The feature of the laminated type shown in FIG. 18(a) is a structure in which an insulating material 442 whose electron barrier is small and whose dielectric constant is high is arranged on one side of an insulating film 441 with the MIM structure in the thickness direction. In this case, a leakage current is reduced on the insulating film side having a high electron barrier in a low electric field, the band of the insulating film whose dielectric constant is low is preferentially bent in a high electric field and thus the voltage-polarity dependency of the leakage current (asymmetry of the leakage current) appears. As a result, a structure is obtained in which not only the ratio of currents at the read time (off) and at the set, reset time (on) can be increased in comparison with a single-layered insulating film but also a rectification characteristic is provided.

The feature of the impurity level type shown in FIG. 18(b) is that impurity elements 443 are added to one side of an insulating film 441 with the MIM structure in the thickness direction to create trap levels and a tunnel current via the levels is utilized. Also, in this case, the tunnel current via the levels is increased by application of a high electric field and the same effect as that of the laminated type can be attained.

The feature of the dot type shown in FIG. 18(c) is that semiconductor or metal fine crystals (dots) 444 are buried in one side of an insulating film 441 with the MIM structure in the thickness direction. In this case, if the dot size is reduced to several nm, the conduction band end or Fermi level rises by the coulomb blockade effect to provide asymmetrical concave potential barrier distribution. Thus, the same effect as that of the laminated type can be obtained. The dot size is preferably set in the range of 0.2 to 1.3 nm described in the first embodiment. The range approximately coincides with the range of another semiconductor material, metal material.

The insulating film structure is not only independently used but also combinations thereof can be made. One example of a combination of applied materials is shown below.

Laminated insulating film: lower side ($Ta_2O_5$, $TiO_2$)×upper side ($SiO_2$, SiN, $Al_2O_3$) or the like Impurity insulating film: base material ($SiO_2$, SiN, $Al_2O_3$, high-k/$SiO_2$)×impurity (Ge, N, Al) or the like Dot insulating film: base material ($SiO_2$, $Al_2O_3$)×dots (Si, Ge, Al) or the like As the characteristics required for the above insulating films, a high breakdown withstand voltage is given as described in the first embodiment. Therefore, like the first embodiment, the actual film thickness of the insulating film is discussed. The range of total actual film thickness T of the impurity insulating film and dot insulating film is the same as the range described in the first embodiment and is expressed by the expression (2). Further, a structure suitable for the unipolar operation is obtained by arranging the average position of impurities and dots at this time on the outer side of ±0.2×T from the center of the base material Next, a case of two layers is explained. If n=2 is used in Equations (8) to (10), actual film thickness T1 that prevents the first layer from being broken down is expressed by the following range.

$$T_1 > V_1/(2.45 \times \epsilon_1^{-0.51}) \tag{11}$$

$$V_1 = V/\{(\epsilon_1/T_1)(T_2/\epsilon_2)+1\} \tag{12}$$

$$10W > T1+T2 \tag{13}$$

W (nm) indicates the lateral width of the non-ohmic element and the aspect ratio that makes an etching process possible is set to 10 or less. In the case of the second layer, the relationship of Equations (11) and (12) can be applied as it is by simply exchanging the relationship of the subscripts 1, 2 of the denominator in Equation (12). These limit the actual film thickness range of the two-layered laminated insulating film described in this embodiment and a highly reliable non-ohmic element structure can be realized.

In this embodiment, an application example of oxide, nitride as the insulating material is mainly described, but like the first embodiment, the effectiveness of a silicate film, aluminate film, oxynitride film, mixed film and various multi-layer films can be maintained. Further, the same effect can be attained even when a film is formed not by use of the film formation method of the above materials but by use of sputtering, ALCVD, vapor deposition and plasma CVD or the like.

Further, in the cross-point memory forming process, it becomes indispensable to perform selective oxidation that oxides and recovers only process damage (defects) of the side surfaces of the non-ohmic element without oxidizing metal interconnection lines/electrodes like the first embodiment. Therefore, a damage-free cell structure is completed by heating in an atmosphere in which heavy water ($D_2O$) is discharged to selectively oxidize defects of the side surfaces of the insulating film of the non-ohmic element without oxidizing metal interconnection lines•electrodes.

Modification

This invention is not limited to the embodiments described above. In the embodiments, the non-ohmic element, variable resistance element are sequentially laminated in this order from the substrate side, but the lamination order may be reversed. Further, Si can be used as metal of the MIM structure as the non-ohmic element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a substrate having a memory control circuit module provided on a part of a surface portion,
    an interlayer insulating film formed on the substrate,
    a first interconnection layer having a plurality of interconnection lines arranged parallel to one another and provided on the interlayer insulating film,
    a second interconnection layer provided separately from the first interconnection layer above the interlayer insulating film and including a plurality of interconnection lines arranged parallel to one another in a direction that intersects with the first interconnection layer, and
    memory cell modules that are respectively provided in intersecting portions of the first interconnection layer and the second interconnection layer, so as to be sandwiched between the first interconnection layer and the second interconnection layer, and each of which has a structure in which a non-ohmic element layer having an insulating film and metal films sandwiching the insulating film and a variable resistance element layer configured to store a state of a difference in resistance as information are laminated,
    wherein the insulating film of the non-ohmic element layer includes plural layers whose electron barriers and dielectric constants are different.

2. The nonvolatile semiconductor memory device according to claim 1, wherein an insulating material film having a smaller potential barrier and larger dielectric constant than a main material of the insulating film is inserted in a central portion in a thickness direction of the insulating film of the non-ohmic element layer.

3. The nonvolatile semiconductor memory device according to claim 1, wherein an insulating material film having a smaller potential barrier and larger dielectric constant than a main material of the insulating film is arranged on one side in a thickness direction of the insulating film of the non-ohmic element layer.

4. A nonvolatile semiconductor memory device comprising:
    a substrate having a memory control circuit module provided on a part of a surface portion,
    an interlayer insulating film formed on the substrate,
    a first interconnection layer having a plurality of interconnection lines arranged parallel to one another and provided on the interlayer insulating film,
    a second interconnection layer provided separately from the first interconnection layer above the interlayer insulating film and including a plurality of interconnection lines arranged parallel to one another in a direction that intersects with the first interconnection layer, and
    memory cell modules that are respectively provided in intersecting portions of the first interconnection layer and the second interconnection layer, so as to be sandwiched between the first interconnection layer and the second interconnection layer, and each of which has a structure in which a non-ohmic element layer having an insulating film and metal films sandwiching the insulating film and a variable resistance element layer configured to store a state of a difference in resistance as information are laminated,
    wherein impurity atoms that form defect levels are added into the insulating film of the non-ohmic element layer.

5. The nonvolatile semiconductor memory device according to claim 4, wherein the impurity atoms are added into a central portion in a thickness direction of the insulating film of the non-ohmic element layer.

6. The nonvolatile semiconductor memory device according to claim 4, wherein the impurity atoms are added into one side in a thickness direction of the insulating film of the non-ohmic element layer.

7. A nonvolatile semiconductor memory device comprising:
    a substrate having a memory control circuit module provided on a part of a surface portion,
    an interlayer insulating film formed on the substrate,
    a first interconnection layer having a plurality of interconnection lines arranged parallel to one another and provided on the interlayer insulating film,
    a second interconnection layer provided separately from the first interconnection layer above the interlayer insulating film and including a plurality of interconnection lines arranged parallel to one another in a direction that intersects with the first interconnection layer, and
    memory cell modules that are respectively provided in intersecting portions of the first interconnection layer and the second interconnection layer, so as to be sandwiched between the first interconnection layer and the second interconnection layer, and each of which has a structure in which a non-ohmic element layer having an insulating film and metal films sandwiching the insulating film and a variable resistance element layer configured to store a state of a difference in resistance as information are laminated,
    wherein one of semiconductor and metal dots is included in the insulating film of the non-ohmic element layer.

8. The nonvolatile semiconductor memory device according to claim 7, wherein the one of semiconductor and metal dots is provided in a central portion in a thickness direction of the insulating film of the non-ohmic element layer.

9. The nonvolatile semiconductor memory device according to claim 7, wherein the semiconductor or metal dots are provided on one side in a thickness direction of the insulating film of the non-ohmic element layer.

10. A nonvolatile semiconductor memory device comprising:
    a first interconnection layer,
    a second interconnection layer provided above the first interconnection layer and intersecting the first interconnection layer, and
    memory cell modules provided between the first interconnection layer and the second interconnection layer at a portion of the intersecting and each of which has a structure in which a non-ohmic element layer having an insulating film and metal films sandwiching the insulating film and a variable resistance element layer configured to store a state of a difference in resistance as information are laminated between the first interconnection layer and the second interconnection layer, wherein the insulating film of the non-ohmic element layer includes one feature selected from the group consisting of a first feature that the insulating film includes plural layers whose electron barriers and dielectric constants are different, a second feature that the insulating film includes impurity atoms that form defect levels in the insulating film, and a third feature that the insulating film includes one of semiconductor and metal dots.

* * * * *